(12) United States Patent
Wang et al.

(10) Patent No.: US 10,115,804 B2
(45) Date of Patent: Oct. 30, 2018

(54) METHOD FOR MANUFACTURING SEMICONDUCTOR DEVICE (71) Applicant: INSTITUTE OF MICROELECTRONICS, CHINESE ACADEMY OF SCIENCES, Beijing (CN)

(72) Inventors: Guilei Wang, Beijing (CN); Junfeng Li, Beijing (CN); Jinbiao Liu, Beijing (CN); Chao Zhao, Kessel-lo (BE)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 8 days.

(21) Appl. No.: 14/698,624

(22) Filed: Apr. 28, 2015

(65) Prior Publication Data
US 2015/0325662 A1  Nov. 12, 2015

(30) Foreign Application Priority Data

May 9, 2014  (CN) .......................... 2014 1 0196176

(51) Int. Cl.
*H01L 29/66* (2006.01)
*H01L 29/423* (2006.01)
(Continued)

(52) U.S. Cl.
CPC .. *H01L 29/66545* (2013.01); *H01L 21/28079* (2013.01); *H01L 21/28088* (2013.01);
(Continued)

(58) Field of Classification Search
CPC .......... H01L 29/66545; H01L 29/4966; H01L 21/28185; H01L 29/7843; H01L 29/517; H01L 29/513; H01L 21/28088; H01L 21/28568; H01L 29/66613; H01L 21/28556; H01L 21/28079; H01L 29/4236; H01L 29/7833
See application file for complete search history.

(56) References Cited

U.S. PATENT DOCUMENTS

| 2002/0072209 A1* | 6/2002 | Tseng ................ H01L 21/28061 438/592 |
| 2004/0113213 A1* | 6/2004 | Maekawa ............ H01L 21/265 257/411 |

(Continued)

*Primary Examiner* — Julio J. Maldonado
*Assistant Examiner* — Stanetta Isaac
(74) *Attorney, Agent, or Firm* — Christensen, Fonder, Dardi & Herbert PLLC (57) ABSTRACT

A method for manufacturing a semiconductor device, comprising: forming a gate trench on a substrate; forming a gate dielectric layer and a metal gate layer thereon in the gate trench; forming a first tungsten (W) layer on a surface of the metal gate layer, and forming a tungsten nitride (WN) blocking layer by injecting nitrogen (N) ions; and filling with W through an atomic layer deposition (ALD) process. The blocking layer prevents ions in the precursors from aggregating on an interface and penetrating into the metal gate layer and the gate dielectric layer. At the same time, adhesion of W is enhanced, a process window of W during planarization is increased, reliability of the device is improved and the gate resistance is further reduced.

10 Claims, 6 Drawing Sheets (51) Int. Cl.

| | |
|---|---|
| *H01L 21/285* | (2006.01) |
| *H01L 21/28* | (2006.01) |
| *H01L 29/49* | (2006.01) |
| *H01L 29/51* | (2006.01) |
| *H01L 29/78* | (2006.01) |

(52) U.S. Cl.
CPC .. *H01L 21/28185* (2013.01); *H01L 21/28556* (2013.01); *H01L 21/28568* (2013.01); *H01L 29/4236* (2013.01); *H01L 29/4966* (2013.01); *H01L 29/513* (2013.01); *H01L 29/517* (2013.01); *H01L 29/66613* (2013.01); *H01L 29/7843* (2013.01); *H01L 29/7833* (2013.01)

(56) References Cited

U.S. PATENT DOCUMENTS

| | | | | |
|---|---|---|---|---|
| 2008/0076076 | A1* | 3/2008 | Obeng | G03F 7/423 |
| | | | | 430/329 |
| 2008/0296660 | A1* | 12/2008 | Park | H01L 21/28061 |
| | | | | 257/324 |
| 2012/0146159 | A1* | 6/2012 | Wang | G03F 7/70633 |
| | | | | 257/410 |
| 2013/0256621 | A1* | 10/2013 | Park | H01L 45/06 |
| | | | | 257/2 |
| 2015/0228491 | A1* | 8/2015 | Kang | H01L 21/28194 |
| | | | | 257/330 |

* cited by examiner

Fig. 14 ered through the ALD process, B$_2$H$_6$

METHOD FOR MANUFACTURING SEMICONDUCTOR DEVICE

RELATED APPLICATION

The present application claims priority to Chinese Patent Application No. 201410196176.9 filed May 9, 2014, the disclosure of which is hereby incorporated by reference herein in its entirety.

TECHNICAL FIELD

The present disclosure relates to the field of semiconductor manufacturing, and particularly to a method for manufacturing a semiconductor device.

BACKGROUND

Currently, the manufacturing process of the Complementary Metal Oxide Semiconductor Field Effect Transistor (CMOSFET) is researched approximately in two directions, i.e., a gate-first process and a gate-last process.

The gate-last process is widely applied in the advanced integrated circuit manufacturing process. The gate-last process generally includes firstly forming a pseudo gate and a source-drain region, and then removing the pseudo gate and re-filling a gate trench with an alternative gate of a high-k metal gate stack. As the gate is formed after a source and a drain are formed, the gate will not sustain a high annealing temperature in the process. Therefore, the material of the gate layer is more widely selected and the intrinsic properties of the material can be better embodied.

Conventional approaches such as CVD, PVD etc. are typically used to prepare metal such as Al, Mo etc. to form a metal filling layer of the alternative gate. However, the step coverage thereof is poor, and an ultrathin metal layer of a small-sized device is difficult to be controlled through a subsequent CMP process. Thereby, quality of the prepared metal layer fails to meet process requirements of a device in a size less than 40 nm.

An Atomic Layer Deposition (ALD) process is surface reaction-limited based on chemical absorption, which can provide intrinsic single-layer deposition, and achieve 100% step coverage in a gap with a high depth-to-width ratio. Currently, the gate trench is generally filled with metal W through the ALD process in the gate-last process, to form top-layer metal of the alternative gate. In this way, a high-quality metal layer with good step coverage and gap filling capability is provided, thereby meeting requirements of the device in a size of less than 40 nm.

However, when W is prepared through the ALD, B$_2$H$_6$ and WF$_6$ are typically used as precursors. In this case, B will diffuse into the metal gate and a gate dielectric layer with high-k material, which will influence the performance and reliability of the device.

SUMMARY

In order to solve at least the above technical defects, the present disclosure provides a method for manufacturing a semiconductor device, to avoid diffusion of B when W is prepared through the ALD, thereby improving the performance of the device.

For this purpose, the present disclosure provides a method for manufacturing a semiconductor device, comprising:

forming a gate trench on a substrate;

forming a gate dielectric layer and a metal gate layer thereon in the gate trench;

forming a first tungsten (W) layer on a surface of the metal gate layer, and forming a WN blocking layer by injecting nitride (N) ions; and filling with W through an Atomic Layer Deposition (ALD) process.

Alternatively, forming a tungsten nitride (WN) blocking layer comprises:

performing heating in an ALD reaction chamber;

forming the first W layer through the ALD process; and forming the WN blocking layer by injecting the N ions and performing annealing.

Alternatively, a temperature range of heating is from 250° to 350°.

Alternatively, the method further comprises: after forming a metal gate layer and before filling with W, performing preheating; and forming a Si diffusion blocking layer by decomposing Si-containing gas.

Alternatively, filling with W through an ALD process comprises: filling with W by alternatively performing a first reaction and a second reaction, wherein, reactant gas for the first reaction comprises Si-containing reactant gas, and reactant gas for the second reaction comprises borane (B$_2$H$_6$).

Alternatively, the Si-containing gas is silicane (SiH$_4$) or silicon ethane (Si$_2$H$_6$).

Alternatively, a deposition rate of the second reaction is less than a deposition rate of the first reaction.

Alternatively, filling with W through an ALD process further comprises:

forming a second W layer by pre-inducing SiH$_4$ or Si$_2$H$_6$ to process a surface of the device and react with silicon fluoride (WF); and filling with W by inducing B$_2$H$_6$ for reaction.

Alternatively, the method further comprises: between forming the gate dielectric layer and forming the metal gate layer, forming a cap layer, to block metal ions of an upper layer from diffusing into the gate dielectric layer.

Alternatively, the cap layer includes Ti, Ta, TaN, TiN, WN, or a combination thereof.

In the method for manufacturing a semiconductor device according to the embodiments of the present disclosure, the WN blocking layer is formed by injecting N ions. When subsequently performing the filling with W through the ALD, the blocking layer prevents ions in the precursors from aggregating on an interface and penetrating into the metal gate layer and the gate dielectric layer. With this method, the N content in WN may be accurately controlled, thereby achieving optimum blocking performance. At the same time, adhesion of W is enhanced, a process window of W during planarization is increased, reliability of the device is improved and the gate resistance is further reduced.

BRIEF DESCRIPTION OF THE DRAWINGS

The above and/or additional aspects and advantages of the present disclosure will become obvious and easily understood from the description of the embodiments in combination with accompanying drawings below. In the figures.

DETAILED DESCRIPTION OF THE EMBODIMENTS

Embodiments of the present disclosure will be described in detail below. Examples of the embodiments are illustrated in accompanying drawing, throughout which the same or similar reference signs are used to represent the same or similar elements or elements with the same or similar functions. The embodiments described with reference to the accompanying drawings below are exemplary, and are merely used to explain the present disclosure instead of limiting the present disclosure.

Figure 1:
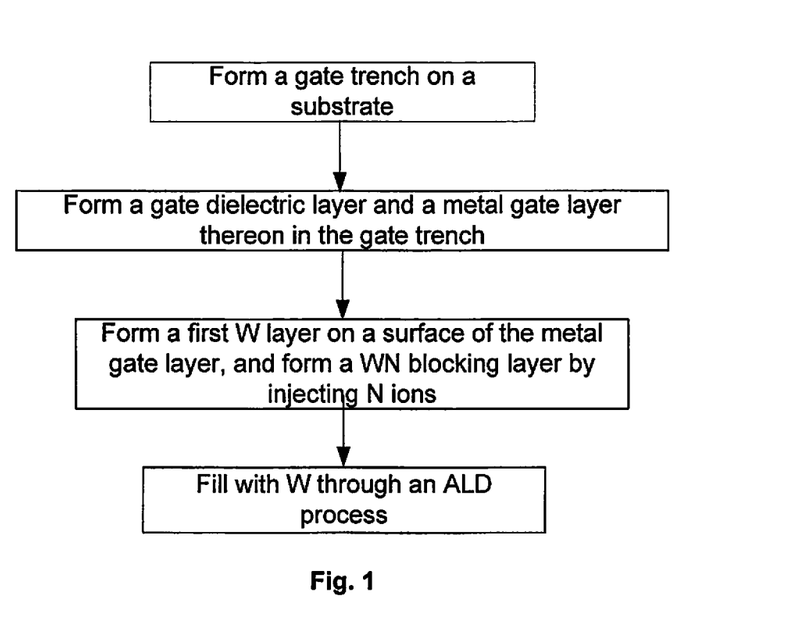
FIG. 1 illustrates a flowchart of a method for manufacturing a semiconductor device according to an embodiment of the present disclosure.

In order to reduce diffusion of elements, especially B, in the precursors when W is prepared through the ALD thereby improving the performance of the device, the present disclosure proposes a method for manufacturing a semiconductor device, as shown in FIG. 1, including the following steps:

forming a gate trench on a substrate;
forming a gate dielectric layer and a metal gate layer thereon in the gate trench;
forming a first W layer on a surface of the metal gate layer, and forming a WN blocking layer by injecting N ions; and
filling with W through an ALD process.

In the present disclosure, the WN blocking layer is formed by injecting N ions. When subsequently performing the W with filling through the ALD, the blocking layer prevents ions in the precursors from aggregating on an interface and penetrating into the metal gate layer and the gate dielectric layer. With this method, the N content in WN may be accurately controlled, thereby achieving optimum blocking performance. At the same time, adhesion of W is enhanced, a process window of W during planarization is increased, reliability of the device is improved and the gate resistance is further reduced.

For better understanding, the present disclosure will be described in detail below in combination with specific embodiments and accompanying drawings.

Firstly, a pseudo gate structure is formed, as shown in FIG. 1.

Figure 2:
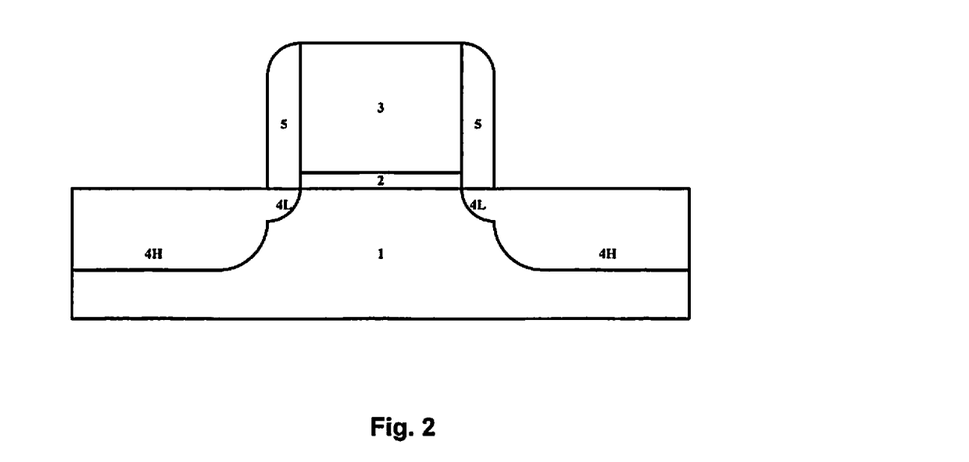
FIGS. 2-14 illustrate sectional views of various manufacturing processes for forming a semiconductor device in a manufacturing method according to an embodiment of the present disclosure.

Specifically, a substrate 1 is firstly provided, as shown in FIG. 2.

The substrate 1 may be a conventional semiconductor Si-based substrate such as bulk Si, Silicon on Insulator (SOI) etc., or body Ge or Ge on Insulator (GeOI), or a compound semiconductor substrate such as SiGe, GaAs, GaN, InSb, InAs etc. The substrate may be selected according to requirements on electrical performance of a specific semiconductor device to be manufactured thereon. In the present disclosure, the semiconductor device described in the present embodiment is for example a Metal Oxide Semiconductor Field Effect Transistor (MOSFET). Therefore, in view of compatibility with other processes and cost control, the bulk Si or SOI is preferably used as the material of the substrate 1. In addition, the substrate 1 may be doped to form a well region (not shown), for example, a P-well region in an n substrate of a PMOS device. In the present embodiment, the substrate 1 is a bulk Si substrate.

Next, a bedding layer 2 is deposited on the substrate 1, as shown in FIG. 2.

The bedding layer 2 may be a nitride, an oxide, or a nitric oxide for example, SiN, SiO, and SiON etc., and may be formed by deposition through conventional processes such as LPCVD, PECVD, HDPCVD, RTO etc. The bedding layer 2 is used as a stopping layer to be etched later, so as to protect the substrate 1. A thickness of the bedding layer 2 may be set according to requirements of the etching process. In the present embodiment, the bedding layer 2 is SiO.

Next, a pseudo gate 3 is deposited on the bedding layer 2, as shown in FIG. 2.

The pseudo gate 3 is formed by deposition through conventional processes such as LPCVD, PECVD, HDPCVD, MBE, ALD, evaporation, sputtering etc. The material of the pseudo gate 3 includes polycrystalline silicon, amorphous silicon, microcrystalline silicon, amorphous carbon, amorphous germanium or a combination thereof, which is used to control a shape of the gate in the gate-last process. In the present embodiment, the pseudo gate 3 is polycrystalline silicon.

Next, the bedding layer 2 and the pseudo gate 3 are etched and patterned, to form the pseudo gate structure, as shown in FIG. 2.

Figure 3:
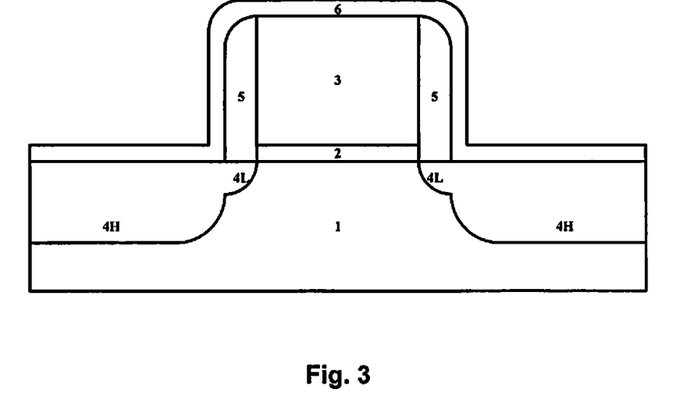
Figure 4:
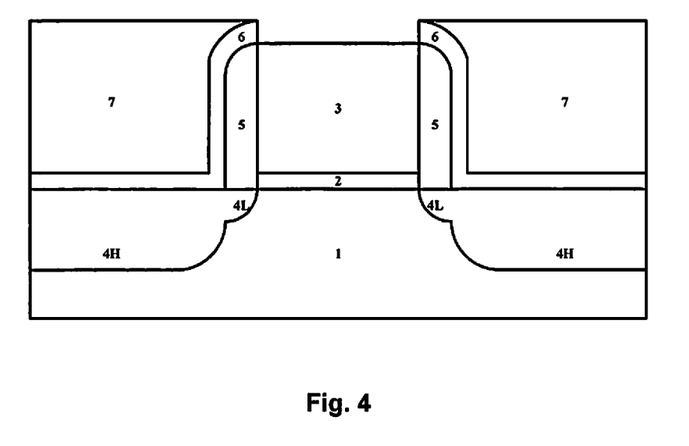

Then, other structures of the semiconductor device excluding the gate structure are further formed, as shown in FIGS. 2-4.

Specifically, first of all, ions are injected into the source and drain for the first time using the pseudo gate as a mask, to form lightly-doped source and drain extended regions 4L with shadow pn junctions, i.e., an LDD structure, in the substrate 1 on both sides of the pseudo gate structure, as shown in FIG. 2.

Then, insulated isolation material is deposited on a surface of the whole device and is etched, and a side wall 5 of the gate is formed merely on the substrate 1 surrounding the pseudo gate structure. The material of the side wall 5 of the gate includes a nitride, an oxide, a nitric oxide, Diamond-Like Carbon (DLC) or a combination thereof, and may be selected to be different from both those of the bedding layer 2 and the pseudo gate 3, to facilitate selective etching. Particularly, the side wall 5 of the gate may include a multilayered structure (not shown), including for example, a first side wall of the gate having a vertical portion and a horizontal portion in an L sectional shape, and a second side wall of the gate above the horizontal portion of the first side wall of the gate having a high stress. The material of the second side wall of the gate may include SiN or DLC, and has a stress preferably greater than 2 GPa.

Next, ions are injected into the source and drain for the second time using the side wall 5 of the gate as a mask, to form heavily-doped source-drain heavily-doped regions 4H with deep pn junctions in the substrate 1 on both sides of the side wall 5 of the pseudo gate. The source-drain extended regions 4L and the source-drain heavily-doped regions 4H commonly form source-drain region 4 of the MOSFET. The doping type, concentration, and depth thereof are set according to requirements on electrical properties of the MOSFET device.

Next, preferably, with reference to FIG. 3, a stress liner 6 may be formed on the whole device. The stress liner 6 is formed through conventional processes such as LPCVD, PECVD, HDPCVD, MBE, ALD, magnetron sputtering, magnetic Filtered Cathodic Vacuum Arc (FCVA), to cover the source-drain region, the side wall 5 of the gate, and the pseudo gate 3. The material of the stress liner 6 may be a SiO, SiN, SiON, DLC or a combination thereof. In the present embodiment, the material of the stress liner 6 is SiN, and preferably has a stress of which an absolute value is greater than 1 GPa for example. For a PMOS, the stress liner 6 may have a compressive stress of which an absolute value is greater than 3 GPa for example; and for an NMOS, the stress liner 6 may have a tensile stress of which an absolute value is greater than 2 GPa for example. A thickness of the stress liner 6 is for example from 10 nm to 1000 nm. In addition, the stress liner 6 may also be a combination of DLC and SiN, or SiN doped with other elements such as C, F, S, P, to improve the stress of SiN.

Next, an Inter-Layer Dielectric (ILD) layer 7 is formed and etched to expose the pseudo gate. An ILD layer 7 with low-k material is formed through conventional approaches such as spin coating, spray coating, screen printing, CVD etc. The material of the ILD layer 7 includes but is not limited to organic low-k material (for example, aryl-containing or multi-ring-containing organic polymer), inorganic low-k material (for example, $SiO_2$, amorphous CN film, polycrystalline BN film, fluorosilicic glass, BSG, PSG, BPSG), and porous low-k material (for example, SSQ-based porous low-k material, porous $SiO_2$, porous SiOCH, C-doped SiO2, F-doped porous amorphous carbon, porous diamond, porous organic polymer). The ILD layer 7 and the stress liner 6 are planarized using technologies such as back-etching (wet and/or dry etching), CMP, until the pseudo gate 3 is exposed, as shown in FIG. 4.

Figure 5:
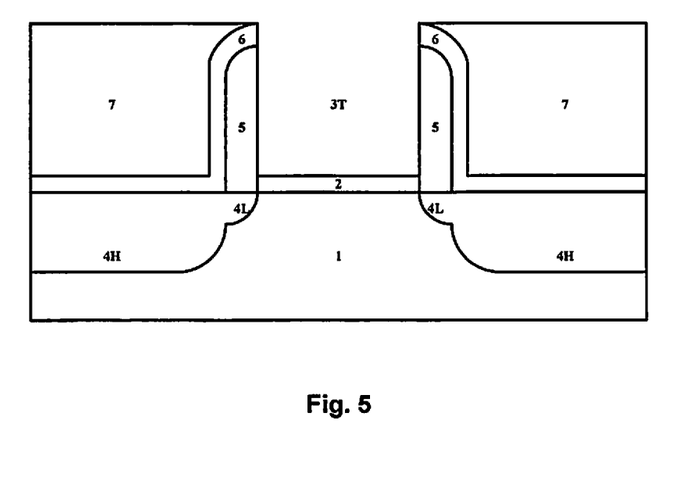

Next, a gate trench 3T is formed, as shown in FIG. 5.

The pseudo gate 3 with a Si-based material such as polycrystalline silicon, amorphous silicon, microcrystalline silicon etc. may be removed using the TMAH wet etching or plasma dry etching such as fluorocarbon based gas, until the bedding layer 2 is exposed.

Figure 6:
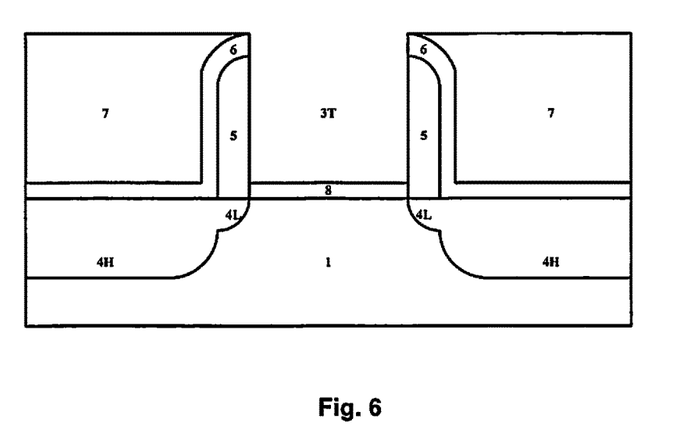

Next, an interface layer may further be reformed. Specifically, the SiO bedding layer 2 may be removed using an HF wet etching solution, and an exposed surface of the substrate 1 is cleaned and dried, to reduce the defect of the surface of the channel region. Then, an interface layer 8 is formed in the gate trench 3T on the substrate 1, as shown in FIG. 6. In the present embodiment, the interface layer 8 is formed by SiO, and may be formed using conventional approaches such as PECVD, HDPCVD, MBE, ALD etc. Alternatively, the interface layer 8 may be formed using a chemical oxidation approach. For example, the SiO interface layer 8 is formed by soaking the surface of the substrate 1 with Si material in deionized water with a certain percentage of ozone for 20 seconds to oxidize the surface. The thin interface layer is used to reduce an interface state density between the substrate 1 and the gate dielectric layer with high-k material which is formed later.

Figure 7:
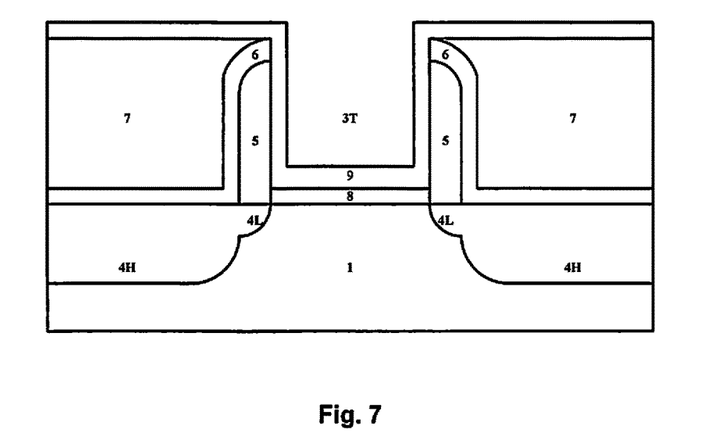
Figure 8:
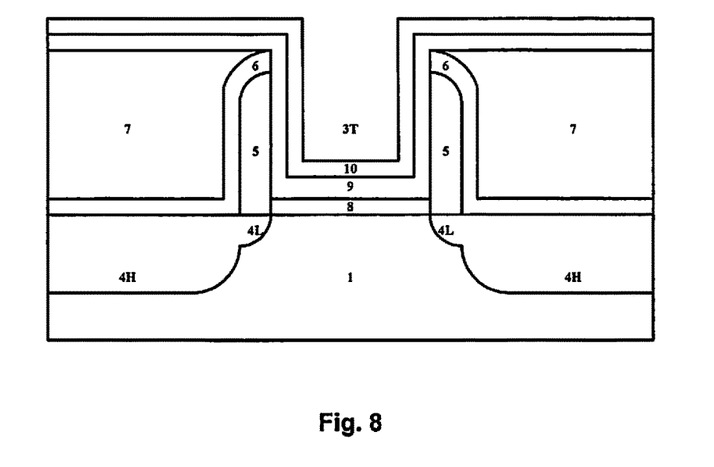
Figure 9:
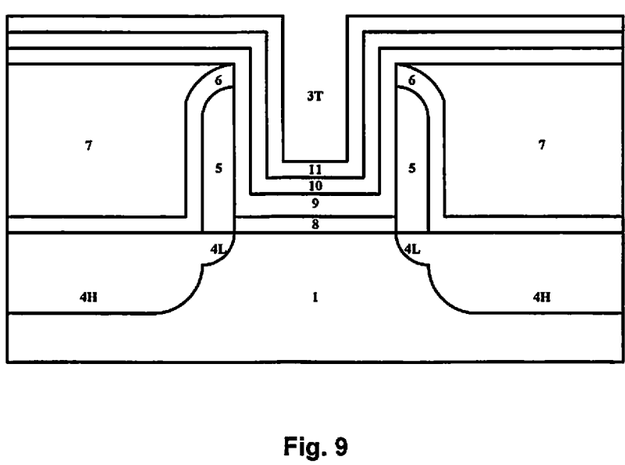

Then, alternative gate dielectric layer 9, metal blocking layer 10 and metal gate layer 11 are deposited in turn, as shown in FIGS. 7-9.

The gate dielectric layer 9 may be of high-k dielectric material (with a higher dielectric constant than SiO), which includes but is not limited to nitride (such as SiN, AlN, TiN), metal oxide (which primarily is oxide of subgroup and lanthanide metal elements, such as $Al_2O_3$, $Ta_2O_5$, $TiO_2$, ZnO, $ZrO_2$, $HfO_2$, $CeO_2$, $Y_2O_3$, $La_2O_3$), and perovskite phase oxide (such as PbZrxTi1-xO$_3$ (PZT), BaxSr1-xTiO$_3$ (BST)). The gate dielectric layer 9 may be formed using conventional approaches such as CVD, PVD, ALD etc. Next, the gate dielectric layer 9 is annealed for example at 450° C. for 15 seconds using Post-Deposition Annealing (PDA), to improve the quality of the high-k dielectric material.

The material of the metal blocking layer 10 may be for example Ti, Ta, TiN, TaN or a combination thereof. The metal blocking layer may block metal in an upper layer (Al in the metal gate etc.) from diffusing into the gate dielectric layer 9. Further, the blocking layer may be comprised of WN, to further prevent B from diffusing downwards into the gate dielectric layer 9 in the process of subsequently forming W, and improve adhesion of the ALD W film.

In the present embodiment, the metal gate layer 11 is a function layer for adjusting a work function in the metal gate. For an NMOS, Al and TiAl may be selected for the metal gate layer 11, and for a PMOS, Ti, TiN, Ta, and TaN may be selected for the metal gate layer 11. The deposition approach is for example CVD, PVD, ALD etc. In other embodiments, the metal gate layer may also be any gate layer in the metal gate stack before a metal filling layer as the top layer is formed.

Figure 10:
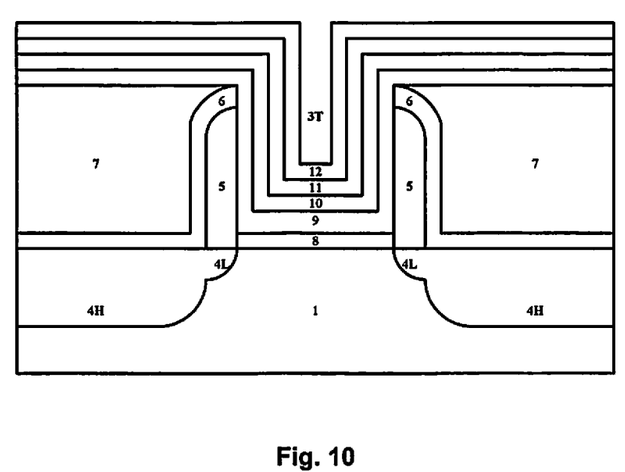

Next, a first W layer is formed on the surface of the metal gate layer, and N ions are injected, to form a WN blocking layer 12, as shown in FIG. 10.

The WN blocking layer 12 may be used to adjust the work function of the gate and barrier the blocking layer. At the same time, in the process of subsequently depositing the W layer through the ALD process, ions such as B in the precursors thereof may be effectively blocked from diffusing downwards into the gate and the gate dielectric layer, and adhesion of the W layer, the process window when the W layer is subsequently planarized and reliability are improved.

More preferably, a thin Si diffusion blocking layer may further be formed (not shown). In a specific implementation, firstly, a wafer may be pre-heated. The wafer may be transferred to a CVD reaction chamber, to be heated to 300° C. In this way, the heat of the whole wafer is improved, thereby facilitating motion of molecules, which is beneficial for subsequent reaction and deposition. Next, Si-containing gas such as $SiH_4$ is induced, and after the Si-containing gas is decomposed, a thin Si layer is formed by deposition. The thin Si layer is a monatomic Si layer, which can also avoid ions such as F in the precursors from diffusing downwards into the gate and gate dielectric layer when the W layer is subsequently formed through the ALD.

Figure 11:
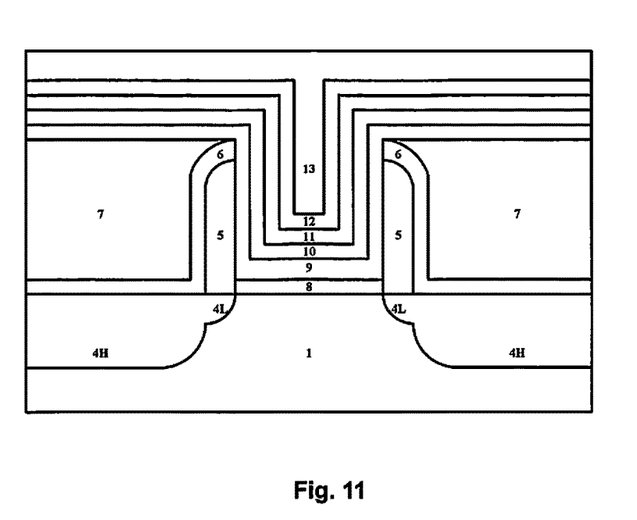

Next, filling with W 13 is performed through the ALD process, as shown in FIG. 11.

In an embodiment, the W layer is filled by alternatively performing a first reaction and a second reaction. Reactant gas of the first reaction includes Si-containing reactant gas, and reactant gas of the second reaction includes $B_2H_6$. The Si-containing reactant gas may be any Si-containing precursor reactant gas for forming W in the ALD process, such as $SiH_4$ or $Si_2H_6$ etc. In the present embodiment, $SiH_4$ and $WF_6$ are used as the reactant gas in the first reaction, and $B_2H_6$ and WF are used as the reactant gas in the second reaction. Specifically, surface treatment is firstly performed using the $SiH_4$ gas. Then, a W layer is formed through reaction, wherein there is no B in the formed W. Next, $B_2H_6$ is induced for reaction, to further form the W layer. In this way, a cycle of deposition of W is completed. Then, the above steps are repeated to alternatively induce $SiH_4$ and $B_2H_6$, to form a W layer in which a $SiH_4$ W layer and a $B_2H_6$ W layer are alternatively stacked. In the present embodiment, a deposition rate of $SiH_4$ W layer is for example 5 Å/cycle to 7 Å/cycle, and preferably, 6 Å/cycle; a deposition rate of $B_2H_6$ W layer is for example 2.3 Å/cycle to 3.0 Å/cycle, and preferably, 2.7 Å/cycle; and finally a thickness of the formed W layer 13 is for example 10~1000 Å, and preferably, 750 Å.

In other embodiments, filling with W may be performed through other ALD processes. In a specific embodiment, $SiH_4$ or $Si_2H_6$ may pre-induced for processing a surface of the device, and is reacted with WF to form a $SiH_4$ W layer, in which there is no B element. Then, $B_2H_6$ continues to be induced for reaction, so as to filling with W subsequently.

In practice, in the process of forming the blocking layer by injecting N ions, if B content in the metal grate layer 11 is less than or equal to 5%, or a diffusion depth of B is less than or equal to 5% of a total thickness of the metal gate layer 11, B can effectively be prevented from penetrating the interface between the metal gate layer and the gate dielectric layer. In this way, adhesion of W is enhanced, the process window when W is planarized is increased, the reliability of the device is improved, and the gate resistance is further reduced.

Figure 12:
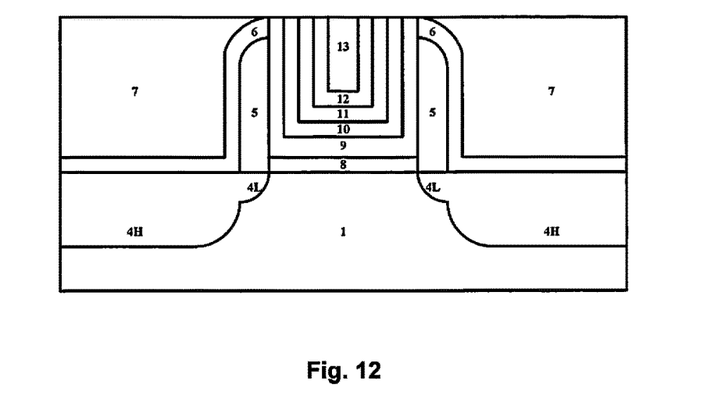

Then, planarization is performed, to form the alternative gate, as shown in FIG. 12.

The planarization may be performed through CMP, until the ILD layer 7 is exposed, thereby forming the alternative gate in the gate trench.

Figure 13:
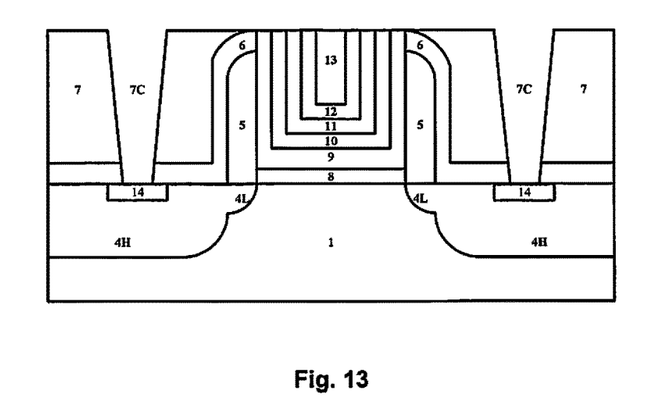
Figure 14:
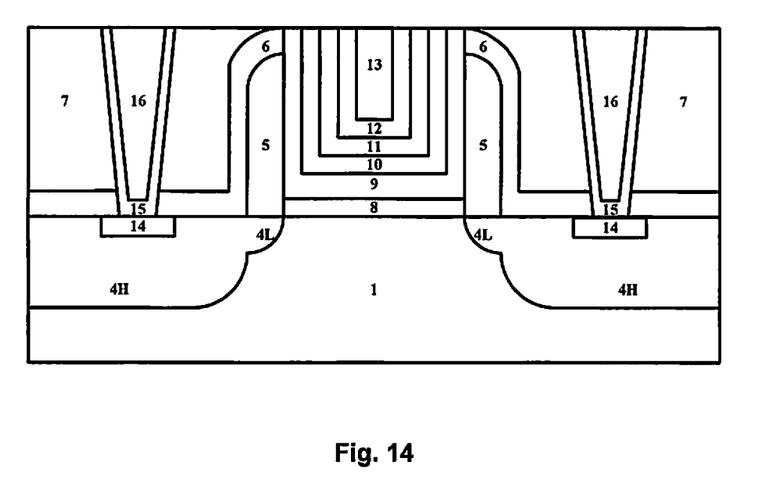

Next, subsequent processes for manufacturing the device are completed as needed. For example, a metal silicon layer 14 and a source-drain contact etc. are formed, as shown in FIGS. 13 and 14.

In the present embodiment, a source-drain contact hole 7C is firstly formed by etching in the ILD layer 7, until the source-drain region 4H are exposed. Ni, Pt, Co, Ti etc. are deposited in the source-drain contact hole 7C to form a thin metal layer. The thin metal layer is annealed to react with Si in the source-drain region to form the metal silicon layer 14. Then, the unreacted thin metal layer is removed using wet etching, as shown in FIG. 13. Then, TiN or TaN blocking layer 15 with a thickness of 1-7 nm is deposited in the source-drain contact hole 7C, and then metal such as W, Al, Mo, Cu or a combination thereof is deposited through CVD and ALD, to form source-drain contact 16; and finally CMP or back-etching is performed, until the ILD layer 7 is exposed. In this way, the source-drain contact is formed, as shown in FIG. 14.

The above description is merely preferable embodiments of the present disclosure, instead of limiting the present disclosure in form.

Although the present disclosure has been disclosed in combination with preferable embodiments, it is not intended to limit the present disclosure. Without departing from the scope of the technical solutions of the present disclosure, any skilled in the an can make changes and modifications to the technical solutions of the present document or amend the above embodiments to equivalent embodiments using the method and technical contents disclosed above. Therefore, any amendment, equivalent variation or modification, which is made to the above embodiments based on the technical essence of the present disclosure without departing from the contents of the technical solutions of the present disclosure, should belong to the protection scope of the technical solutions of the present disclosure.

What is claimed is:

1. A method for manufacturing a semiconductor device, comprising:
    forming a gate trench on a substrate;
    forming a gate dielectric layer and a metal gate layer thereon in the gate trench;
    forming a first tungsten (W) layer on a surface of the metal gate layer, and
    forming a tungsten nitride (WN) blocking layer by injecting nitrogen (N) ions into the first W layer; and
    forming a second tungsten (W) layer on the tungsten nitride (WN) blocking layer through an Atomic Layer Deposition (ALD) process;
    wherein the WN blocking layer is used to prevent elements in the precursors when forming the second W layer from diffusing downwards; and
    wherein in forming the WN blocking layer, the N content in WN is controlled, such that elements in the metal gate layer is less than or equal to 5%, or a diffusion depth of the elements is less than or equal to 5% of a total thickness of the metal gate layer when forming the second W layer.

2. The method according to claim 1, wherein forming a WN blocking layer comprises:
    performing heating in an ALD reaction chamber;
    forming the first W layer through the ALD process; and
    forming the WN blocking layer by injecting the N ions and performing annealing.

3. The method according to claim 2, wherein a temperature range of heating is from 250° to 350°.

4. The method according to claim 1, further comprising: between forming a metal gate layer and forming the second W layer,
    performing preheating; and
    forming a Si diffusion blocking layer by decomposing Si-containing gas.

5. The method according to claim 1, wherein forming the second W layer through an ALD process comprises: forming the second W layer by alternatively performing a first reaction and a second reaction, wherein, reactant gas for the first reaction comprises Si-containing reactant gas, and reactant gas for the second reaction comprises borane ($B_2H_6$).

6. The method according to claim 5, wherein the Si-containing gas is silicane ($SiH_4$) or silicon ethane ($Si_2H_6$).

7. The method according to claim 5, wherein a deposition rate of the second reaction is less than a deposition rate of the first reaction.

8. The method according to claim 1, wherein forming the second W layer through an ALD process further comprises:
    pre-inducing SiH4 or Si2H6 to process a surface of the device and react with silicon fluoride (WF); and
    inducing $B_2H_6$ for reaction.

9. The method according to claim 1, further comprising: between forming the gate dielectric layer and forming the metal gate layer, forming a cap layer, to block metal ions of an upper layer from diffusing into the gate dielectric layer.

10. The method according to claim 9, wherein the cap layer includes Ti, Ta, TaN, TiN, WN, or a combination thereof.

* * * * *